US009837461B1

(12) United States Patent
Yao

(10) Patent No.: US 9,837,461 B1
(45) Date of Patent: Dec. 5, 2017

(54) IMAGE SENSOR DEVICES

(71) Applicant: Silicon Optronics, Inc., Hsinchu (TW)

(72) Inventor: Yu-Yuan Yao, Hsinchu (TW)

(73) Assignee: SILICON OPTRONICS, INC., Hsinchu (TW)

( * ) Notice: Subject to any disclaimer, the term of this patent is extended or adjusted under 35 U.S.C. 154(b) by 0 days.

(21) Appl. No.: 15/418,433

(22) Filed: Jan. 27, 2017

(30) Foreign Application Priority Data

Nov. 24, 2016 (TW) .............................. 105138590 A

(51) Int. Cl.
*H01L 27/146* (2006.01)
*H01L 27/14* (2006.01)

(52) U.S. Cl.
CPC .... *H01L 27/14645* (2013.01); *H01L 27/1463* (2013.01)

(58) Field of Classification Search
CPC ..... H01L 27/14; H01L 27/1463; H01L 31/00; H01L 31/101; H01L 27/146; H01L 27/1464; H01L 27/14645
USPC ........................................................ 257/440
See application file for complete search history.

(56) References Cited

U.S. PATENT DOCUMENTS

| 6,403,998 B1 * | 6/2002 | Inoue ................ H01L 27/14603 257/292 |
| 2007/0114627 A1 * | 5/2007 | Roy .................. H01L 27/14645 257/431 |
| 2010/0102206 A1 * | 4/2010 | Cazaux ............. H01L 27/14603 250/208.1 |

* cited by examiner

*Primary Examiner* — Chuong A Luu
(74) *Attorney, Agent, or Firm* — Muncy, Geissler, Olds & Lowe, P.C.

(57) ABSTRACT

An image sensor device is provided. The image sensor device includes a substrate, a first photoelectric conversion unit, a second photoelectric conversion unit, a third photoelectric conversion unit, a plurality of isolation structures, a first doped region, and a second doped region. The first, second, and third photoelectric conversion units are disposed in the substrate. The second photoelectric conversion unit is located between the first photoelectric conversion unit and the third photoelectric conversion unit. The isolation structures are disposed in the substrate between the photoelectric conversion units. The first doped region is formed in the substrate below the isolation structures. The first doped region extends below the third photoelectric conversion unit. The second doped region is formed in the substrate below a part of the first doped region. The second doped region extends below the second photoelectric conversion unit.

14 Claims, 2 Drawing Sheets

IMAGE SENSOR DEVICES

CROSS REFERENCE TO RELATED APPLICATIONS

This Application claims priority of Taiwan Patent Application No. 105138590, filed on Nov. 24, 2016, the entirety of which is incorporated by reference herein.

TECHNICAL FIELD

The technical field relates to an image sensor device capable of effectively improving photosensitive efficiency.

BACKGROUND

An image sensor device is a kind of semiconductor device that transforms optical images into electrical signals. Image sensor devices can be generally classified into charge coupled device (CCD) image sensor devices and complementary metal oxide semiconductor (CMOS) image sensor devices. Among these image sensor devices, the CMOS image sensor device comprises a photodiode for detecting incident light and transforming it into electrical signals, and logic circuits for transmitting and processing the electrical signals.

In a conventional image sensor device, a shallow trench isolation (STI) and a P-type doped region below the STI are adopted as electrical isolation between individual photodiodes. The individual photodiodes absorb various light wavelengths, resulting in the positions of photons converted into electrons in different depths. However, the photosensitive areas of the individual photodiodes are conventionally designed to have the same depth. Thus, the electrons located in a deeper position of the photosensitive areas can very easily overflow onto adjacent photosensitive areas and produce crosstalk problems, resulting in poor recovery of electronic signals. At the present time, the manner of increasing in the length of the shallow trench isolation (STI) or the P-type doped region below the STI in the substrate is used to solve the crosstalk problems. However, in an implantation process, when trying to deepen the length of the P-type doped region in the substrate, deviations can easily occur in the width, profile, or position of the P-type doped region deep in the substrate, and this can generate additional interference inhibiting signal recovery. As a result, this method is not effective in improving photosensitive efficiency.

Therefore, development of an image sensor device capable of effectively improving photosensitive efficiency is desirable.

SUMMARY

In accordance with one embodiment of the invention, an image sensor device is provided. The image sensor device comprises a substrate, a first photoelectric conversion unit, a second photoelectric conversion unit, a third photoelectric conversion unit, a plurality of isolation structures, a first doped region, and a second doped region. The first, second, and third photoelectric conversion units are disposed in the substrate. The second photoelectric conversion unit is located between the first photoelectric conversion unit and the third photoelectric conversion unit. The isolation structures are disposed in the substrate between the photoelectric conversion units. The first doped region is formed in the substrate below the isolation structures. The first doped region extends below the third photoelectric conversion unit. The second doped region is formed in the substrate below a part of the first doped region. The second doped region extends below the second photoelectric conversion unit.

In one embodiment, the first photoelectric conversion unit absorbs a first light wavelength, the second photoelectric conversion unit absorbs a second light wavelength, and the third photoelectric conversion unit absorbs a third light wavelength, wherein the first light wavelength is larger than the second light wavelength, and the second light wavelength is larger than the third light wavelength.

In one embodiment, the first photoelectric conversion unit is a red photodiode, the second photoelectric conversion unit is a green photodiode, and the third photoelectric conversion unit is a blue photodiode.

In one embodiment, the isolation structures comprise shallow trench isolation (STI).

In one embodiment, the second doped region is extended further below the third photoelectric conversion unit.

In this embodiment, the present image sensor device further comprises a third doped region formed in the substrate which is located below the second doped region and extended below the first photoelectric conversion unit.

In this embodiment, the first photoelectric conversion unit, the second photoelectric conversion unit and the third photoelectric conversion unit have a first doping type.

In this embodiment, the first doped region and the second doped region have a second doping type opposite to the first doping type.

In this embodiment, the third doped region has a third doping type opposite to the second doping type.

In one embodiment, the present image sensor device further comprises a third doped region formed in the substrate which is located below the second doped region and extended below the third photoelectric conversion unit.

In this embodiment, the present image sensor device further comprises a fourth doped region formed in the substrate which is located below the third doped region and extended below the first photoelectric conversion unit.

In this embodiment, the first photoelectric conversion unit, the second photoelectric conversion unit and the third photoelectric conversion unit have a first doping type.

In this embodiment, the first doped region and the second doped region have a second doping type opposite to the first doping type.

In this embodiment, the third doped region and the fourth doped region have a third doping type opposite to the second doping type.

In the present invention, according to the difference in light wavelengths absorbed by the respective photodiodes (e.g., red, green and blue photodiodes) in the image sensor device, a design of various laterally extending profiles of the P-type and N-type doped regions located below the respective photodiodes is made (as shown in FIGS. 1 and 2) to adjust the photosensitive areas of the respective photodiodes to have a specific and suitable depth. For example, the depth of the photosensitive area of the red photodiode is greater than the depth of the photosensitive area of the green photodiode, and the depth of the photosensitive area of the green photodiode is greater than the depth of the photosensitive area of the blue photodiode, such that respective photodiodes are able to keep the required photosensitive area corresponding to the light wavelength range. In addition, the electrons located in the respective P-type or N-type doped regions are effectively excluded through the application of a positive voltage drop to the N-type doped region with a continuous profile, preventing the electrons from overflowing between the adjacent photosensitive areas to generate crosstalk. Therefore, any interference that could possibly be generated between the adjacent photosensitive areas is greatly reduced and recovery of the photo-electric signals of the respective photodiodes is aided by the isolation effect formed by the P-type and N-type doped regions. In accordance with the above characteristics, the present invention is capable of effectively improving the photosensitive efficiency of the image sensor device.

A detailed description is given in the following embodiments with reference to the accompanying drawings.

BRIEF DESCRIPTION OF THE DRAWINGS

The invention can be more fully understood by reading the subsequent detailed descriptions and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
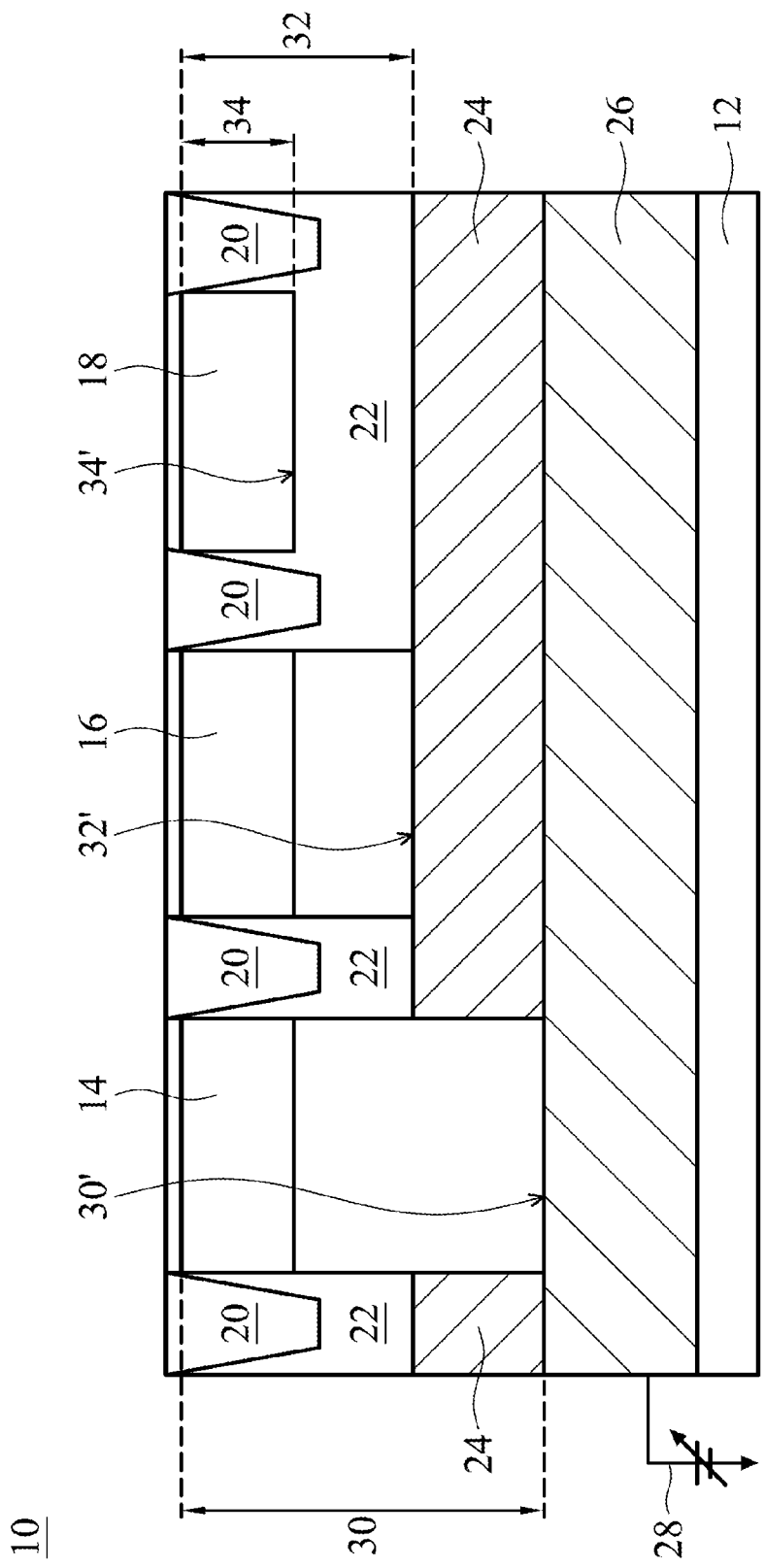
FIG. 1 is a cross-sectional view of an image sensor device in accordance with one embodiment of the invention.

Referring to FIG. 1, in accordance with one embodiment of the invention, an image sensor device is disclosed. FIG. 1 is a cross-sectional view of an image sensor device 10 in this embodiment.

As shown in FIG. 1, the image sensor device 10 comprises a substrate 12, a first photoelectric conversion unit 14, a second photoelectric conversion unit 16, a third photoelectric conversion unit 18, a plurality of isolation structures 20, a first doped region 22, and a second doped region 24.

The first photoelectric conversion unit 14, the second photoelectric conversion unit 16 and the third photoelectric conversion unit 18 are disposed in the substrate 12, and the second photoelectric conversion unit 16 is located between the first photoelectric conversion unit 14 and the third photoelectric conversion unit 18.

In some embodiments, the first photoelectric conversion unit 14 absorbs a first light wavelength, the second photoelectric conversion unit 16 absorbs a second light wavelength, and the third photoelectric conversion unit 18 absorbs a third light wavelength. The first light wavelength is larger than the second light wavelength, and the second light wavelength is larger than the third light wavelength.

In this embodiment, the first photoelectric conversion unit 14 is a red photodiode, the second photoelectric conversion unit 16 is a green photodiode, and the third photoelectric conversion unit 18 is a blue photodiode.

The isolation structures 20 are disposed in the substrate 12 and are located between the photoelectric conversion units (14, 16 and 18).

In some embodiments, the isolation structures 20 may comprise shallow trench isolation (STI).

Specifically, the first doped region 22 is formed in the substrate 12 which is located below the isolation structures 20 and extended below the third photoelectric conversion unit 18 such that the first doped region 22 with a continuous profile is formed below the third photoelectric conversion unit 18 (the first doped region 22 is not formed below the first photoelectric conversion unit 14 and the second photoelectric conversion unit 16).

In addition, the second doped region 24 is formed in the substrate 12 which is located below the first doped region 22 and extended below the second photoelectric conversion unit 16 such that the second doped region 24 with a continuous profile is formed below the second photoelectric conversion unit 16 and the third photoelectric conversion unit 18 (the second doped region 24 is not formed below the first photoelectric conversion unit 14).

In this embodiment, the image sensor device 10 further comprises a third doped region 26 formed in the substrate 12 which is located below the second doped region 24 and extended below the first photoelectric conversion unit 14 such that the third doped region 26 with a continuous profile is formed below the first photoelectric conversion unit 14, the second photoelectric conversion unit 16 and the third photoelectric conversion unit 18.

In some embodiments, the third doped region 26 is further connected to a positive voltage drop 28.

Therefore, a photosensitive area 30 of the first photoelectric conversion unit 14, a photosensitive area 32 of the second photoelectric conversion unit 16, and a photosensitive area 34 of the third photoelectric conversion unit 18 are clearly defined.

As shown in FIG. 1, the photosensitive area 30 of the first photoelectric conversion unit 14 includes the area of the first photoelectric conversion unit 14 and the area between the first photoelectric conversion unit 14 and the third doped region 26. The photosensitive area 32 of the second photoelectric conversion unit 16 includes the area of the second photoelectric conversion unit 16 and the area between the second photoelectric conversion unit 16 and the second doped region 24. The photosensitive area 34 of the third photoelectric conversion unit 18 includes the area of the third photoelectric conversion unit 18. That is, the bottom 30' of the photosensitive area 30 of the first photoelectric conversion unit 14 is adjacent to the third doped region 26, the bottom 32' of the photosensitive area 32 of the second photoelectric conversion unit 16 is adjacent to the second doped region 24, and the bottom 34' of the photosensitive area 34 of the third photoelectric conversion unit 18 is adjacent to the first doped region 22.

The depth of the photosensitive area 30 of the first photoelectric conversion unit (a red photodiode) 14 is greater than the depth of the photosensitive area 32 of the second photoelectric conversion unit (a green photodiode) 16. The depth of the photosensitive area 32 of the second photoelectric conversion unit (a green photodiode) 16 is greater than the depth of the photosensitive area 34 of the third photoelectric conversion unit (a blue photodiode) 18. That is, in the image sensor device 10 disclosed by this embodiment, the photoelectric conversion unit which absorbs a larger light wavelength has a correspondingly deeper photosensitive area.

In some embodiments, in the image sensor device 10, the depth of the photosensitive area 30 of the first photoelectric conversion unit (a red photodiode) 14 ranges from 3.0 μm to 4.2 μm.

In some embodiments, in the image sensor device 10, the depth of the photosensitive area 32 of the second photoelectric conversion unit (a green photodiode) 16 ranges from 1.0 μm to 1.6 μm.

In some embodiments, in the image sensor device 10, the depth of the photosensitive area 34 of the third photoelectric conversion unit (a blue photodiode) 18 ranges from 0.3 μm to 0.6 μm.

In some embodiments, the first photoelectric conversion unit 14, the second photoelectric conversion unit 16 and the third photoelectric conversion unit 18 have a first doping type, for example, an N-doping type.

In some embodiments, the first doped region 22 and the second doped region 24 have a second doping type, for example, a P-doping type, which is opposite to the first doping type (i.e. an N-doping type).

In some embodiments, the third doped region 26 has a third doping type, for example, an N-doping type, which is opposite to the second doping type (i.e. a P-doping type).

In some embodiments, the doping concentration of the first doped region 22 is smaller than the doping concentration of the second doped region 24.

In some embodiments, the doping concentration of the first doped region 22 ranges from about $1E18$ $cm^{-3}$ to about $1E19$ $cm^{-3}$.

In some embodiments, the doping concentration of the second doped region 24 ranges from about $1E19$ $cm^{-3}$ to about $1E20$ $cm^{-3}$.

Figure 2:
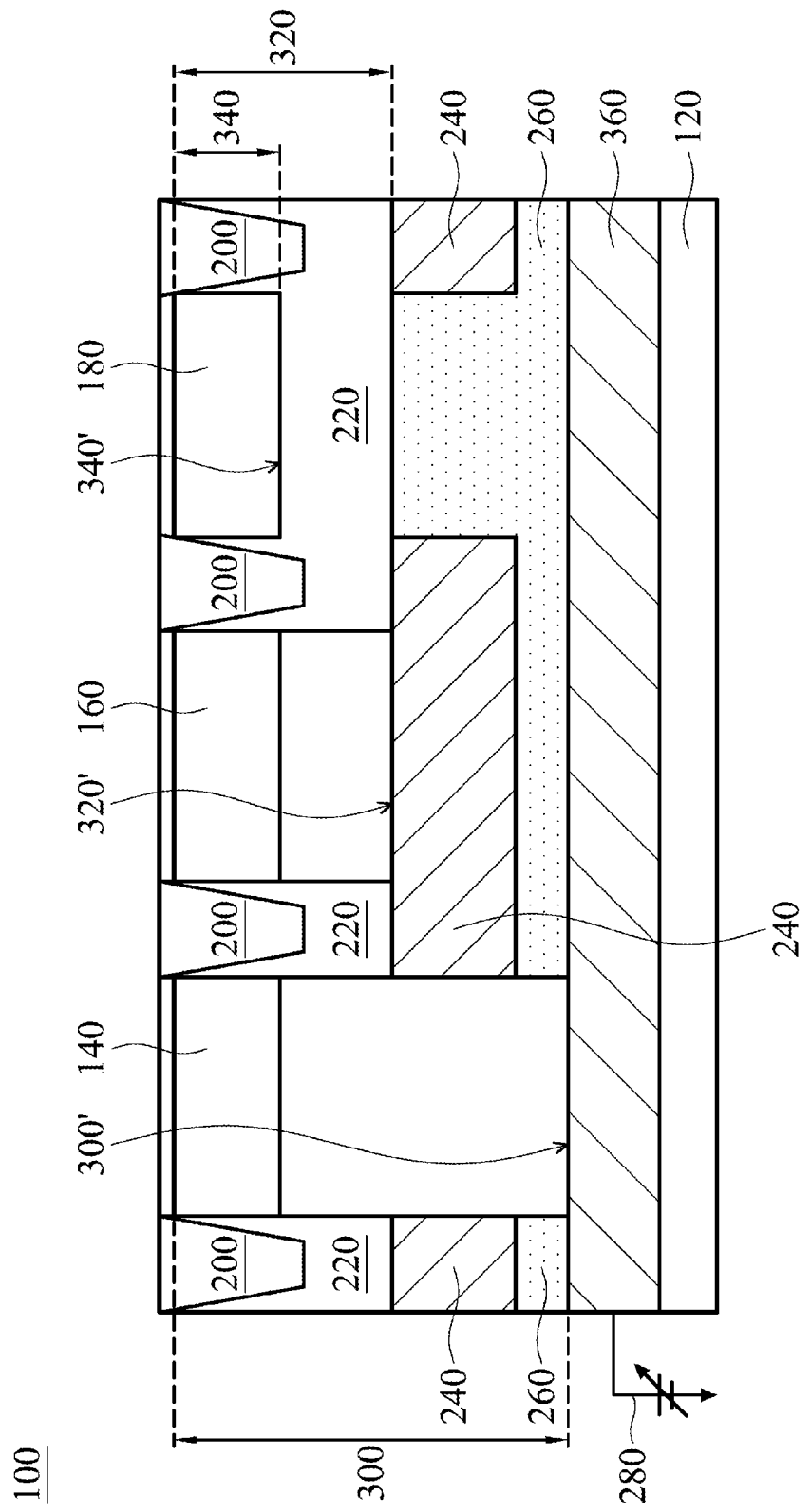
FIG. 2 is a cross-sectional view of an image sensor device in accordance with one embodiment of the invention.

Referring to FIG. 2, in accordance with one embodiment of the invention, an image sensor device is disclosed. FIG. 2 is a cross-sectional view of an image sensor device 100 in this embodiment.

As shown in FIG. 2, the image sensor device 100 comprises a substrate 120, a first photoelectric conversion unit 140, a second photoelectric conversion unit 160, a third photoelectric conversion unit 180, a plurality of isolation structures 200, a first doped region 220, and a second doped region 240.

The first photoelectric conversion unit 140, the second photoelectric conversion unit 160 and the third photoelectric conversion unit 180 are disposed in the substrate 120, and the second photoelectric conversion unit 160 is located between the first photoelectric conversion unit 140 and the third photoelectric conversion unit 180.

In some embodiments, the first photoelectric conversion unit 140 absorbs a first light wavelength, the second photoelectric conversion unit 160 absorbs a second light wavelength, and the third photoelectric conversion unit 180 absorbs a third light wavelength. The first light wavelength is larger than the second light wavelength, and the second light wavelength is larger than the third light wavelength.

In this embodiment, the first photoelectric conversion unit 140 is a red photodiode, the second photoelectric conversion unit 160 is a green photodiode, and the third photoelectric conversion unit 180 is a blue photodiode.

The plurality of isolation structures 200 are disposed in the substrate 120 and located between the photoelectric conversion units (140, 160 and 180).

In some embodiments, the isolation structures 200 may comprise shallow trench isolation (STI).

Specifically, the first doped region 220 is formed in the substrate 120 which is located below the isolation structures 200 and extended below the third photoelectric conversion unit 180 such that the first doped region 220 with a continuous profile is formed below the third photoelectric conversion unit 180 (the first doped region 220 is not formed below the first photoelectric conversion unit 140 and the second photoelectric conversion unit 160).

In addition, the second doped region 240 is formed in the substrate 120 which is located below a part of the first doped region 220 and extended below the second photoelectric conversion unit 160 such that the second doped region 240 with a continuous profile is formed below the second photoelectric conversion unit 160 (the second doped region 240 is not formed below the first photoelectric conversion unit 140 and the third photoelectric conversion unit 180).

In this embodiment, the image sensor device 100 further comprises a third doped region 260 formed in the substrate 120 which is located below the second doped region 240 and extended below the third photoelectric conversion unit 180 (including the area between the second doped regions 240) such that the third doped region 260 with a continuous profile is formed below the second photoelectric conversion unit 160 and the third photoelectric conversion unit 180 (the third doped region 260 is not formed below the first photoelectric conversion unit 140).

In this embodiment, the image sensor device 100 further comprises a fourth doped region 360 formed in the substrate 120 which is located below the third doped region 260 and extended below the first photoelectric conversion unit 140 such that the fourth doped region 360 with a continuous profile is formed below the first photoelectric conversion unit 140, the second photoelectric conversion unit 160 and the third photoelectric conversion unit 180.

In some embodiments, the fourth doped region 360 is further connected to a positive voltage drop 280.

Therefore, a photosensitive area 300 of the first photoelectric conversion unit 140, a photosensitive area 320 of the second photoelectric conversion unit 160, and a photosensitive area 340 of the third photoelectric conversion unit 180 are clearly defined.

In addition, as shown in FIG. 2, the photosensitive area 300 of the first photoelectric conversion unit 140 includes the area of the first photoelectric conversion unit 140 and the area between the first photoelectric conversion unit 140 and the fourth doped region 360. The photosensitive area 320 of the second photoelectric conversion unit 160 includes the area of the second photoelectric conversion unit 160 and the area between the second photoelectric conversion unit 160 and the second doped region 240. The photosensitive area 340 of the third photoelectric conversion unit 180 includes the area of the third photoelectric conversion unit 180. That is, the bottom 300' of the photosensitive area 300 of the first photoelectric conversion unit 140 is adjacent to the fourth doped region 360, the bottom 320' of the photosensitive area 320 of the second photoelectric conversion unit 160 is adjacent to the second doped region 240, and the bottom 340' of the photosensitive area 340 of the third photoelectric conversion unit 180 is adjacent to the first doped region 220.

The depth of the photosensitive area 300 of the first photoelectric conversion unit (a red photodiode) 140 is greater than the depth of the photosensitive area 320 of the second photoelectric conversion unit (a green photodiode) 160. The depth of the photosensitive area 320 of the second photoelectric conversion unit (a green photodiode) 160 is greater than the depth of the photosensitive area 340 of the third photoelectric conversion unit (a blue photodiode) 180. That is, in the image sensor device 100 disclosed by this embodiment, the photoelectric conversion unit which absorbs a larger light wavelength has a correspondingly deeper photosensitive area.

In some embodiments, in the image sensor device 100, the depth of the photosensitive area 300 of the first photoelectric conversion unit (a red photodiode) 140 ranges from 3.0 μm to 4.2 μm.

In some embodiments, in the image sensor device 100, the depth of the photosensitive area 320 of the second photoelectric conversion unit (a green photodiode) 160 ranges from 1.0 μm to 1.6 μm.

In some embodiments, in the image sensor device 100, the depth of the photosensitive area 340 of the third photoelectric conversion unit (a blue photodiode) 180 ranges from 0.3 μm to 0.6 μm.

In some embodiments, the first photoelectric conversion unit 140, the second photoelectric conversion unit 160 and the third photoelectric conversion unit 180 have a first doping type, for example, an N-doping type.

In some embodiments, the first doped region 220 and the second doped region 240 have a second doping type, for example, a P-doping type, which is opposite to the first doping type (i.e. an N-doping type).

In some embodiments, the third doped region 260 and the fourth doped region 360 have a third doping type, for example, an N-doping type, which is opposite to the second doping type (i.e. a P-doping type).

In some embodiments, the doping concentration of the first doped region 220 is smaller than the doping concentration of the second doped region 240.

In some embodiments, the doping concentration of the first doped region 220 ranges from about $1E18$ $cm^{-3}$ to about $1E19$ $cm^{-3}$.

In some embodiments, the doping concentration of the second doped region 240 ranges from about $1E19$ $cm^{-3}$ to about $1E20$ $cm^{-3}$.

In some embodiments, the doping concentration of the third doped region 260 is smaller than the doping concentration of the fourth doped region 360.

In some embodiments, the doping concentration of the third doped region 260 ranges from about $1E19$ $cm^{-3}$ to about $1E20$ $cm^{-3}$.

In some embodiments, the doping concentration of the fourth doped region 360 ranges from about $1E19$ $cm^{-3}$ to about $1E20$ $cm^{-3}$.

In the present invention, according to the difference in light wavelengths absorbed by the respective photodiodes (e.g., red, green and blue photodiodes) in the image sensor device, a design of various laterally extending profiles of the P-type and N-type doped regions located below the respective photodiodes is made (as shown in FIGS. 1 and 2) to adjust the photosensitive areas of the respective photodiodes to have a specific and suitable depth. For example, the depth of the photosensitive area of the red photodiode is greater than the depth of the photosensitive area of the green photodiode, and the depth of the photosensitive area of the green photodiode is greater than the depth of the photosensitive area of the blue photodiode, such that respective photodiodes are able to keep the required photosensitive area corresponding to the light wavelength range. In addition, the electrons located in the respective P-type or N-type doped regions are effectively excluded through the application of a positive voltage drop to the N-type doped region with a continuous profile, preventing the electrons from overflowing between the adjacent photosensitive areas to generate crosstalk. Therefore, any interference that could possibly be generated between the adjacent photosensitive areas is greatly reduced and recovery of the photo-electric signals of the respective photodiodes is aided by the isolation effect formed by the P-type and N-type doped regions. In accordance with the above characteristics, the present invention is capable of effectively improving the photosensitive efficiency of the image sensor device.

It will be apparent to those skilled in the art that various modifications and variations can be made to the disclosed embodiments. It is intended that the specification and examples be considered as exemplary only, with the true scope of the invention being indicated by the following claims and their equivalents.

What is claimed is:

1. An image sensor device, comprising:
   a substrate;
   a first photoelectric conversion unit disposed in the substrate;
   a second photoelectric conversion unit disposed in the substrate;
   a third photoelectric conversion unit disposed in the substrate, wherein the second photoelectric conversion unit is located between the first photoelectric conversion unit and the third photoelectric conversion unit;
   a plurality of isolation structures disposed in the substrate located between the photoelectric conversion units;
   a first doped region formed in the substrate located below the isolation structures and extends directly below the third photoelectric conversion unit, wherein the first doped region is not formed directly below the first photoelectric conversion unit and the second photoelectric conversion unit; and
   a second doped region formed in the substrate located below a part of the first doped region and extended below the second photoelectric conversion unit.

2. The image sensor device as claimed in claim 1, wherein the first photoelectric conversion unit absorbs a first light wavelength, the second photoelectric conversion unit absorbs a second light wavelength, and the third photoelectric conversion unit absorbs a third light wavelength, wherein the first light wavelength is larger than the second light wavelength, and the second light wavelength is larger than the third light wavelength.

3. The image sensor device as claimed in claim 1, wherein the first photoelectric conversion unit is a red photodiode, the second photoelectric conversion unit is a green photodiode, and the third photoelectric conversion unit is a blue photodiode.

4. The image sensor device as claimed in claim 1, wherein the isolation structures comprise shallow trench isolation (STI).

5. The image sensor device as claimed in claim 1, wherein the second doped region is extended further below the third photoelectric conversion unit.

6. The image sensor device as claimed in claim 5, further comprising a third doped region formed in the substrate which is located below the second doped region and extended below the first photoelectric conversion unit.

7. The image sensor device as claimed in claim 6, wherein the first photoelectric conversion unit, the second photoelectric conversion unit and the third photoelectric conversion unit have a first doping type.

8. The image sensor device as claimed in claim 7, wherein the first doped region and the second doped region have a second doping type opposite to the first doping type.

9. The image sensor device as claimed in claim 8, wherein the third doped region has a third doping type opposite to the second doping type.

10. The image sensor device as claimed in claim 1, further comprising a third doped region formed in the substrate which is located below the second doped region and extended below the third photoelectric conversion unit.

11. The image sensor device as claimed in claim 10, further comprising a fourth doped region formed in the substrate which is located below the third doped region and extended below the first photoelectric conversion unit.

12. The image sensor device as claimed in claim 11, wherein the first photoelectric conversion unit, the second photoelectric conversion unit and the third photoelectric conversion unit have a first doping type.

13. The image sensor device as claimed in claim 12, wherein the first doped region and the second doped region have a second doping type opposite to the first doping type.

14. The image sensor device as claimed in claim 13, wherein the third doped region and the fourth doped region have a third doping type opposite to the second doping type.

* * * * *